United States Patent [19]
Ke

[11] Patent Number: 6,054,899
[45] Date of Patent: Apr. 25, 2000

[54] AUTOMATIC GAIN CONTROL CIRCUIT WITH LOW DISTORTION

[75] Inventor: Ling-Wei Ke, Tainan Hsien, Taiwan

[73] Assignee: Industrial Technology Research Institute, Hsinchu, Taiwan

[21] Appl. No.: 09/236,194

[22] Filed: Jan. 22, 1999

[30] Foreign Application Priority Data

Jul. 30, 1998 [TW] Taiwan ................................. 87112679

[51] Int. Cl.[7] .................................................. H03G 3/10
[52] U.S. Cl. ......................................... 330/278; 330/310
[58] Field of Search .................................. 330/278, 285, 330/302, 310

[56] References Cited

U.S. PATENT DOCUMENTS

| | | | |
|---|---|---|---|
| 2,812,390 | 11/1957 | Overbeek | 179/171 |
| 4,987,382 | 1/1991 | Saitoh | 330/277 |
| 5,083,095 | 1/1992 | Madaffari | 330/277 |
| 5,389,891 | 2/1995 | Phillippe | 330/253 |
| 5,563,545 | 10/1996 | Scheinberg | 327/389 |

*Primary Examiner*—Robert Pascal
*Assistant Examiner*—Henry Choe
*Attorney, Agent, or Firm*—Morrison & Foerster LLP

[57] ABSTRACT

An automatic gain control circuit is described, comprising: a resistance control node, a first field-effect transistor, a second field-effect transistor, an inductor, a first resistor, a second resistor, a first capacitor, and a second capacitor. The inductor is connected in series with the field-effect transistors. The first resistor is connected between the gate of the first field-effect transistor and the resistance control node while the second resistor is connected between the gate of the second field-effect transistor and the resistance control node. The first capacitor is connected between the gate and drain of the first field-effect transistor, whereas the second capacitor is connected between the gate and source of the second field-effect transistor.

8 Claims, 4 Drawing Sheets

6,054,899

AUTOMATIC GAIN CONTROL CIRCUIT WITH LOW DISTORTION

CROSS-REFERENCE TO RELATED APPLICATION

This application claims priority benefits of Taiwanese Patent Application Serial No. 87112679, filed Jul. 30, 1998, client docket no. 0412-2375-Q.

BACKGROUND OF THE INVENTION

1. Field of the Invention

The present invention relates to frequency conversion circuit. More particularly, the present invention relates to an automatic gain control circuit with low distortion.

2. Description of the Related Art

Frequency converters have been widely applied to cable television system to convert radio frequency (RF) signals to intermediate frequency (IF) signals. As shown in FIG. 1, a frequency converter generally includes three basic functional blocks: an RF amplifier 10, a mixer 12, and a local oscillator 14. Preferably, a circuit design with low noise is utilized to implement the RF amplifier 10 because the RF amplifier 10 is put at the front-end of the reception system. In FIG. 1, the RF amplifier 10 receives and amplifies an RF input signal and the local oscillator 14 generates an LO signal. Then, the mixer 12 combines the RF input signal and the LO signal to generate an IF signal.

The frequency bands for RF, image and LO signals entering the frequency converter applied to the TV tuner and the IF output signal generated by the frequency converter for a cable television system of 50–550 MHz are depicted in FIG. 5. The relationships among the IF, RF, LO and image frequencies for the frequency converter are as follows:

FREQ(IF)=FREQ(LO)−FREQ(RF input)

FREQ(IF)=FREQ(IF image)−FREQ(LO)

A so-called Gilbert type mixer merging the RF amplifier 10 and the mixer 12 of FIG. 1 into a whole has been disclosed, the detailed circuit diagram of which is illustrated in FIG. 2. The Gilbert type mixer, a double balanced mixer, has excellent carrier suppression and low second order distortion. Although the double balanced mixer can be implemented by filters to achieve quite good carrier suppression, the demand on high-value inductors and high-value capacitors consumes a great deal of layout area not suited for use in integrated circuits.

FIG. 2 illustrates the detailed circuitry of a conventional Gilbert type mixer, wherein the mixer 12 (including four field-effect transistors 121, 122, 123, and 124) operates similarly to a standard four quadrant Gilbert variable transconductance multiplier. The RF amplifier 10 comprises a pair of field effect transistors 101 and 102 receiving input from the differential RF signal at terminals RF+ and RF−, amplifying it, and coupling the amplified differential RF input signal to mixer 12. Note that a pair of current sources 103 and 104 are connected in series with the associated field-effect transistors 101 and 102. The mixer 12 receives amplified differential RF input signal from the RF amplifier 10, differential LO signal via terminals LO+ and LO−, and mixes these signals to generate the differential IF output signal at terminals IF+ and IF−.

As shown in FIG. 2, an automatic gain control (AGC) circuit 20 is provided between the sources of the field-effect transistors 101 and 102 to adjust the gain of the receiver so that the IF output signal level remains substantially constant with varying RF input signal levels. The AGC circuit 20 comprises a pair of field-effect transistors 201 and 202 connected in series, a pair of resistors 203 and 204, and a voltage source 205. The voltage source 205 provides a voltage bias to the gates of the field-effect transistors 201 and 202 via the resistors 203 and 204, respectively. The use of two series-connected field-effect transistors 201 and 202 can render the linearity of AC signals quite well along with staged bias control.

However, the fact that the channel resistance $R_{DS}$ of the field-effect transistors 201 and 202 varies with the voltage source 205, as well as the RF small signals at the drain of the field-effect transistor 201 and the source of the field-effect transistor 202, gives rise to non-linear distortion.

Therefore, U.S. Pat. No. 5,563,545 discloses an improved AGC circuit 30 as shown in FIG. 3. In the drawing, the conventional AGC circuit 30 comprises a field-effect transistor 301, two capacitors 302 and 303, a resistor 304, and a voltage source 305. The field-effect transistor 301 are configured with its gate connected to the voltage source 305 through the resistor 304. The capacitor 302 is connected between the drain and gate of the field-effect transistor 301, whereas the capacitor 303 is connected between the source and gate of the field-effect transistor 301.

However, although the AGC circuit 30 of FIG. 3 can reduce non-linear distortion, additional inductors (not shown in the drawing) are required to connect the AGC circuit 30 and the respective sources of the field-effect transistors 101 and 102 in order to attenuate high-frequency noise.

SUMMARY OF THE INVENTION

It is therefore an object of the present invention to provide an automatic gain control circuit having low distortion and low noise figure as compared to the conventional one.

It is another object of the present invention to provide an automatic gain control circuit by integrating the inductors required by the associated field-effect transistors in the differential-stage into a single inductor so as to decrease the required layout area while sustaining high-frequency suppression.

The present invention achieves the above-indicated objects by providing an automatic gain control circuit. The automatic gain control circuit comprises: a resistance control node, a first field-effect transistor, a second field-effect transistor, an inductor, a first resistor, a second resistor, a first capacitor, and a second capacitor. The inductor is connected in series with the field-effect transistors. The first resistor is connected between the gate of the first field-effect transistor and the resistance control node while the second resistor is connected between the gate of the second field-effect transistor and the resistance control node. The first capacitor is connected between the gate and drain of the first field-effect transistor, whereas the second capacitor is connected between the gate and source of the second field-effect transistor.

Accordingly, high-frequency noise occurring to the drain terminal of the field-effect transistor 401 and the source terminal of the field-effect transistor 402 can be coupled by the first capacitor and the second capacitor to the gate terminals of the first field-effect transistor and the second on field-effect transistor, respectively. Thus, the channel resistance can simultaneously vary with the bias coupled to the gate terminals so as to reduce non-linear distortion. In addition, the resistance R of the resistors 406 and 407 is high enough to block RF signal transmitted therethrough and thus prevent the circuit from further power loss. With regards to high-frequency noise (e.g., image frequency), the inductor connected in series with the field-effect transistors can reduce harmonics and ringing-frequency interference. In other words, the AGC circuit of the present invention provides superior high-frequency noise suppression.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 4:
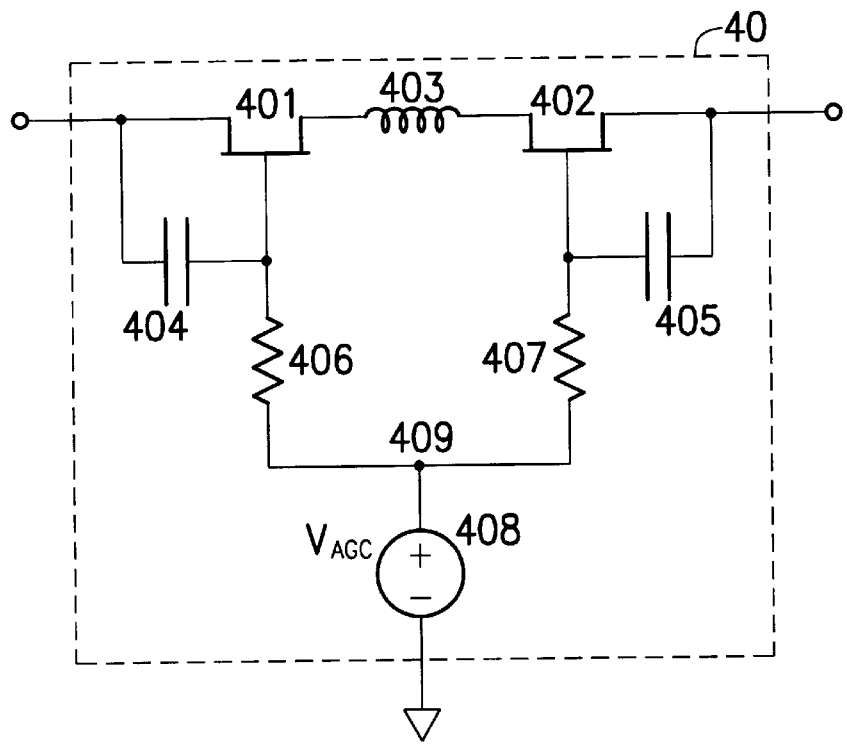
FIG. 4 schematically illustrates the detailed circuit diagram of an AGC circuit in accordance with one preferred embodiment of the present invention.
Figure 5:
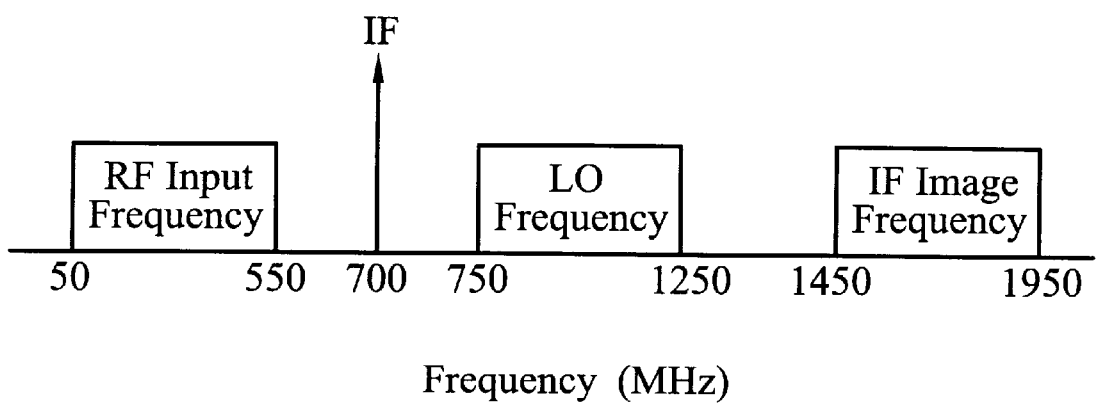
FIG. 5 depicts the frequency bands for RF, image and LO signals entering the frequency converter applied to TV tuner and the IF output signal generated by the frequency converter.

The AGC circuit 40 as shown in FIG. 4 comprises two field-effect transistors 401 and 402, an inductor 403, two capacitors 404 and 405, two resistors 406 and 407, and a voltage source 408.

Figure 1:
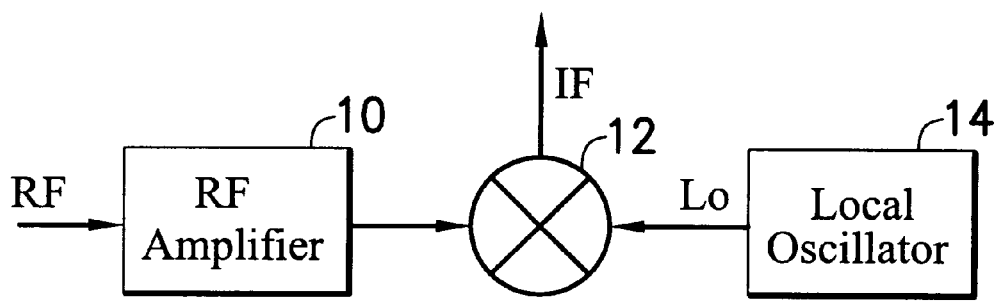
FIG. 1 depicts the block diagram of a frequency converter having an RF amplifier, a mixer, and local oscillator.
Figure 2:
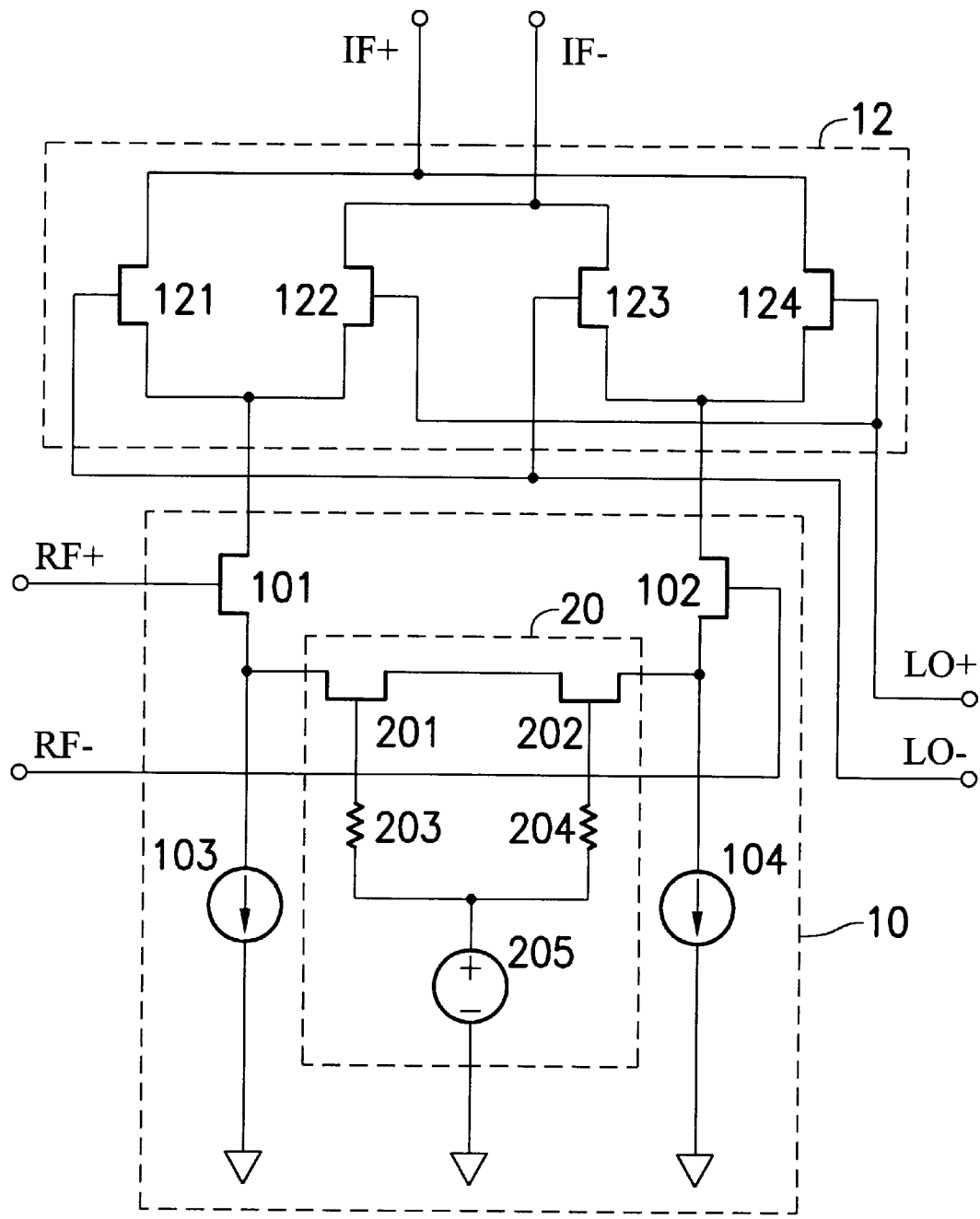
FIG. 2 illustrates the detailed circuitry of a conventional Gilbert type mixer.
Figure 3:
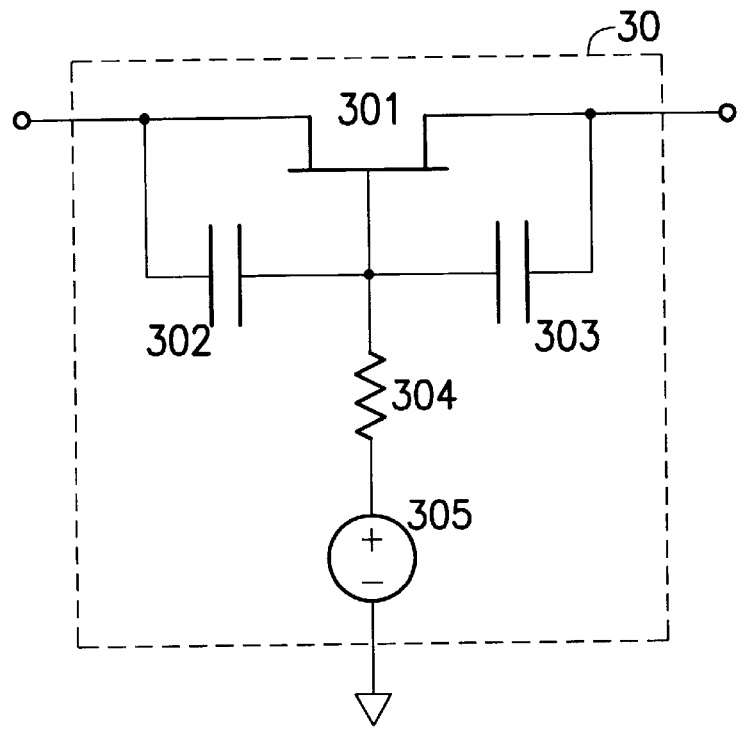
FIG. 3 illustrates the circuit diagram of a conventional automatic gain control circuit.

The field-effect transistor 401 is connected in series with the field-effect transistor 402 by the inductor 403. In other words, the field-effect transistor 401 is configured with its source terminal electrically connected to the drain of the field-effect transistor 402 by the inductor 403. The drain terminal of the field-effect transistor 401 and the source terminal of the field-effect transistor 402 are connected to the sources of the field-effect transistors 101 and 102 of FIG. 2, respectively.

In the drawing, the gate terminals of the field-effect transistors 401 and 402 are biased by the voltage source 408, wherein reference numeral 409 designates a voltage node. The resistor 406 is connected to the gate terminal of the field-effect transistor 401 whereas the resistor 407 is connected to the gate terminal of the field-effect transistor 402. The capacitor 404 is connected between the drain terminal and gate terminal of the field-effect transistor 401. The capacitor 405 is connected between the source terminal and gate terminal of the field-effect transistor 402.

Preferably, the field-effect transistors 401 and 402 have symmetrically matched structures in consideration of the symmetry of the differential RF amplifier. When operating at RF frequency, the capacitors 404 and 405 have matched capacitances, the impedance $(1/\omega C)$ of which should be less than the resistance R of the resistors 406 or 407, that is, $(1/\omega C) < R$, but greater than the channel resistance $R_{DS}$ of the field-effect transistor 401 or 402, that is, $(1/\omega C) > R_{DS}$, so as to maintain the function of automatic gain adjustment. Usually, the required resistance R of the resistors 406 and 407 is at least several kilo-ohms while the capacitors 404 or 405 has the capacitance C of several pico-farads.

Moreover, when operating beyond the RF frequency, the inductor 403 should sustain an impedance greater than the channel resistance $R_{DS}$ of the field-effect transistor 401 or 402, that is, $\omega L > R_{DS}$, in order to suppress high-frequency noise. Preferably, the inductor 403 has an inductance L of several nano-henrys.

The operation of the AGC circuit 40 as shown in FIG. 4 will be described in the following.

According to the present invention, the voltage source 408 supplies a voltage $V_{AGC}$ at the voltage node 409, which is thereby applied to the gate terminals of the field-effect transistors 401 and 402. High-frequency noise occurring to the drain terminal of the field-effect transistor 401 and the source terminal of the field-effect transistor 402 can be coupled by the capacitors 404 and 405 to the gate terminals of the field-effect transistors 401 and 402, respectively. Accordingly, the channel resistance $R_{DS}$ can simultaneously vary with the bias coupled to the gate terminals so as to reduce non-linear distortion. In addition, the resistance R of the resistors 406 and 407 is high enough to block RF signal transmitted therethrough and thus prevent the circuit from further power loss.

With regards to high-frequency noise (e.g., image frequency), the inductor 403 connected in series with the field-effect transistors 401 and 402 can reduce harmonics and ringing-frequency interference by increasing the associated impedance $\omega L$. In other words, the AGC circuit 40 provides superior high-frequency noise suppression.

Furthermore, several AGC circuits 40 of FIG. 4 can be connected in series to acquire further low distortion and low noise figure as well.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. An automatic gain control circuit, comprising:
   a resistance control node;
   a first field-effect transistor and a second field-effect transistor;
   an inductor connected between a source of said first field-effect transistor and a drain of said second field-effect transistor;
   a first resistor connected between a gate of said first field-effect transistor and said resistance control node;
   a second resistor connected between a gate of said second field-effect transistor and said resistance control node;
   a first capacitor connected between said gate and a drain of said first field-effect transistor; and
   a second capacitor connected between said gate and a source of said second field-effect transistor.

2. The automatic gain control circuit as claimed in claim 1, wherein said first capacitor has an impedance less than the resistance of said first resistor when operating at RF frequency.

3. The automatic gain control circuit as claimed in claim 2, wherein said impedance of said first capacitor is greater than the channel resistance of said first field-effect transistor.

4. The automatic gain control circuit as claimed in claim 1, wherein said second capacitor has an impedance less than the resistance of said second resistor when operating at RF frequency.

5. The automatic gain control circuit as claimed in claim 4, wherein said impedance of said second capacitor is greater than the channel resistance of said second field-effect transistor.

6. The automatic gain control circuit as claimed in claim 1, wherein said first capacitor and said second capacitor have matched capacitances.

7. The automatic gain control circuit as claimed in claim 1, wherein said first field-effect transistor and said second field-effect transistor have symmetrically matched structures.

8. The automatic gain control circuit as claimed in claim 1, wherein said inductor has an impedance greater than the channel resistance of said field-effect transistors when operating at a frequency higher than RF frequency.

* * * * *